(12) United States Patent
Cho

(10) Patent No.: US 7,559,988 B2
(45) Date of Patent: Jul. 14, 2009

(54) METHOD AND APPARATUS FOR GROWING HIGH QUALITY SILICON SINGLE CRYSTAL, SILICON SINGLE CRYSTAL INGOT GROWN THEREBY AND WAFER PRODUCED FROM THE SAME SINGLE CRYSTAL INGOT

(75) Inventor: Hyon-Jong Cho, Gumi-si (KR)

(73) Assignee: Siltron Inc. (KR)

( * ) Notice: Subject to any disclaimer, the term of this patent is extended or adjusted under 35 U.S.C. 154(b) by 199 days.

(21) Appl. No.: 11/352,814

(22) Filed: Feb. 13, 2006

(65) Prior Publication Data

US 2007/0022942 A1 Feb. 1, 2007

(30) Foreign Application Priority Data

Jul. 26, 2005 (KR) .................. 10-2005-0068097

(51) Int. Cl.
*C30B 15/20* (2006.01)
(52) U.S. Cl. .................. 117/30; 117/13; 117/32; 117/213
(58) Field of Classification Search .................. 117/30, 117/32, 13, 213
See application file for complete search history.

(56) References Cited

U.S. PATENT DOCUMENTS

| | | | |
|---|---|---|---|
| 5,792,255 A | 8/1998 | Iino et al. | |
| 5,919,302 A | 7/1999 | Falster et al. | |
| 5,938,836 A | 8/1999 | Tomioka et al. | |
| 5,954,873 A | 9/1999 | Hourai et al. | |
| 6,048,779 A | 4/2000 | Watanabe et al. | |
| 6,113,688 A * | 9/2000 | Kawanishi et al. | 117/30 |
| 6,254,672 B1 | 7/2001 | Falster et al. | |
| 6,258,163 B1 * | 7/2001 | Kuragaki | 117/30 |
| 6,287,380 B1 | 9/2001 | Falster et al. | |
| 6,409,826 B2 | 6/2002 | Falter et al. | |
| 6,458,204 B1 | 10/2002 | Okui et al. | |
| 6,521,316 B2 | 2/2003 | Lee et al. | |
| 6,527,859 B2 | 3/2003 | Lee et al. | |
| 6,592,662 B2 | 7/2003 | Fusegawa et al. | |
| 6,869,478 B2 | 3/2005 | Nakamura et al. | |

(Continued)

FOREIGN PATENT DOCUMENTS

EP 1076120 2/2001

(Continued)

OTHER PUBLICATIONS

Machida, et al., "The effects of argon gas flow rate and furnace pressure on oxygen concentration in Czochralski-grown silicon crystals" Journal of Crystal Growth 186, (1998) pp. 362-368 (7 pages).

(Continued)

*Primary Examiner*—Robert M Kunemund
(74) *Attorney, Agent, or Firm*—Grossman, Tucker, Perreault & Pfleger, PLLC

(57) ABSTRACT

The invention relates to a technique for producing a high quality Si single crystal ingot with a high productivity by the Czochralski method. The technique of the invention can control the magnetic field strength of an oxygen dissolution region different from that of a solid-liquid interface region in order to control the oxygen concentration at a desired value.

11 Claims, 11 Drawing Sheets

U.S. PATENT DOCUMENTS 7,226,507 B2 * 6/2007 Mitamura etal. ............. 117/13
7,291,221 B2 * 11/2007 Korb ........................... 117/30
7,300,518 B2 * 11/2007 Fukatsu et al. ................ 117/30

FOREIGN PATENT DOCUMENTS

| JP | 04-017542 | 2/1992 |
|----|-----------|--------|
| JP | 4016589 | 2/1992 |
| JP | 1994-271388 | 9/1994 |
| JP | 1996-264611 | 10/1996 |
| KR | 2002082132 | 10/2002 |

OTHER PUBLICATIONS

Eidenzon, et al., Defect-free Silicon Crystals Grown by the Czochralski Technique, Inorganic Materials, vol. 33, No. 3, 1997, pp. 272-279.

Cho, et al., "High Pulling Rate Defect-Free Crystals with Axially Asymmetric Characteristics Due to Controlled Melt Convection," 210th ECS Meeting, Oct 29-Nov. 3, 2006, Cancun Mexico, vol. 3 Issue 4 (pp. 31-40).

Cho, et al., "The effects of several growth parameters on the formation behavior of point defects in Czochralski-grown silicon crystals," Journal of Crystal Growth 292 (2006) available at www.sciencedirect.com (pp. 260-265).

* cited by examiner

METHOD AND APPARATUS FOR GROWING HIGH QUALITY SILICON SINGLE CRYSTAL, SILICON SINGLE CRYSTAL INGOT GROWN THEREBY AND WAFER PRODUCED FROM THE SAME SINGLE CRYSTAL INGOT

BACKGROUND OF THE INVENTION

1. Field of the Invention

The present invention relates to a high quality silicon (Si) single crystal ingot having desirable oxygen concentration, and more particularly, a high quality Si single crystal ingot and wafer and a growth method and apparatus thereof, in which the temperature distribution and the oxygen concentration distribution of Si melt are controlled independently from each other during the growth of an Si single crystal ingot by the Czochralski method in order to produce a high quality Si single crystal ingot and wafers which have controlled growth defects and oxygen concentrations desirable to customers.

2. Description of the Prior Art

As well known in the art, in order to grow a high quality silicon (Si) single crystal ingot that can enhance the yield of semiconductor devices, temperature control has mainly been conducted on high temperature distribution of the single crystal ingot after crystallization. This is done in order to control contraction-induced stress and so on, resulting from cooling subsequent to crystallization or behavior of point defects built up in solidification.

Also, in order to meet various oxygen specifications (suitable for semiconductor devices) demanded by customers, additional capital has been invested. For example, process parameters such as pressure and argon (Ar) flow rate are adjusted, hot zones are changed, and horizontal strong magnetic field is introduced.

According to a typical process of the Czochralski growth of Si single crystal, polycrystalline Si is loaded into a quartz crucible where it is melted into Si melt under the heat radiated from a heater, and then a Si single crystal ingot is grown from the surface of Si melt. When growing the Si single crystal ingot, the crucible is elevated through the rotation of a shaft that supports the crucible, maintaining the solid-liquid interface at a constant level, and the Si single crystal ingot is wound up while being rotated coaxially with the crucible but with an opposite rotating direction. Upon being grown as above, the Si single crystal ingot is produced into Si single crystal wafers (via wafer machining such as slicing, lapping, polishing and cleaning), which are in turn used as semiconductor device substrates.

In addition, as a typical technique for promoting the growth of the Si single crystal ingot, an inert gas such as Ar is introduced to an ingot-growing apparatus via an upper part thereof and then exhausted from the ingot-growing apparatus via a lower portion thereof.

In addition, for the purpose of stable single crystal ingot production and effective oxygen concentration adjustment, a magnetic field such as a CUSP magnetic field, vertical magnetic field and horizontal magnetic field is generally used with at least a predetermined strength.

Conventional techniques for growing a Si single crystal ingot as above have used a heat shield in order to regulate the temperature gradient of a growing Si single crystal and oxygen evaporation from Si melt. Examples of such conventional techniques may include Korean Patent No. 374703, Korean Patent Application No. 2000-0071000 and U.S. Pat. No. 6,527,859 and so on. As, according to a report by Machita et al., "The effects of argon gas flow rate and furnace pressure on oxygen concentration in Czochralski-grown Si crystals" (Journal of Crystal Growth, 186 (1998) 362-368), and Korean Patent Application No. 2001-7011548, installation of a hot zone such as a gas flow controller as well as adjustment of pressure, Ar flow rate and rotation speed of a crucible are proposed as means for controlling oxygen concentration. Furthermore, Japanese Laid-Open Patent Application Nos. 2000-247788 and H10-130100 disclose restraining oxygen dissolution and melt convection by using an apparatus for adjusting magnetic field strength and a unit for generating a multi-CUSP magnetic field.

However, adjustment of several process parameters of the prior art cannot efficiently control the temperature gradient or oxygen concentration of a Si single crystal ingot. So, it has been impossible to produce a high quality Si single crystal ingot and wafer with low point defect concentration that have oxygen concentrations desirable to customers.

Conditions for preferable wafer substrates suitable for device process are as follows: In an active device region formed from a wafer surface to several microlayers in depth, it is preferable to eliminate all agglomerated defects such as vacancy and self-interstitial, except for point defects. For example, Crystal Originated Pit (COP), as a type of point defects with agglomerated vacancies worsens Gate Oxide Integrity (GOI), thereby dropping device's yield. Furthermore, GOI may worsen if micro precipitates depending on oxygen and vacancy concentration have occurred in the active device region. On the other hand, Bulk Micro Defect(BMD) containing micro precipitates is needed in a bulk region deeper than the active device region. The MBD occurring during heat treatment of a semiconductor device is harmful for the active device area, but improves device's yield by gettering of metal impurities existing in the wafer surface and the active device region. Therefore, a preferable wafer substrate needs suitable vacancy and oxygen concentration.

Meanwhile, as described in Korean Patent Application Nos. 1999-7009261, 1999-7009307 and 1999-7009309, the prior art expresses vertical temperature gradient of crystal in the form of $G0=c+ax^2$. So, vacancy concentration increases gradually to the center from the outer circumference of a single crystal ingot but interstitial concentration decreases. If out-diffusion does not take place by a sufficient degree around the outer circumference of the single crystal ingot, an interstitial crystal defect such as LDP occurs. This causes crystal growth to be carried out with high vacancy concentration in the center. Therefore, a vacancy crystal defect (e.g., void, Oxidation induced Stacking Fault (OiSF)) tends to occur in the center of a wafer owing to vacancy concentration much higher than balance concentration. On the other hand, dropping the cooling rate of crystal for the purpose of interstitial out-diffusion further requires installation of additional hot zones. This decreases the growth rate of the single crystal ingot, thereby lowering productivity.

As approaches for controlling the temperature distribution of a Si single crystal ingot in order to produce a high quality Si single crystal ingot, following conventional technologies have been proposed. Japanese Patent Application No. H02-119891 proposes to control temperature distribution in the center and circumference of a Si single crystal ingot by adopting hot zones during cooling of the ingot in order to reduce crystal defects in the ingot owing to the strain of solidification. This document particularly discloses using a cooling sleeve to increase solidification rate in the growth direction of the single crystal ingot and thus decreasing lattice defect. Furthermore, Japanese Patent Application No. H07-158458 proposes to control the temperature distribution and pulling rate of a single crystal ingot. Japanese Patent Application No.

H07-066074 proposes to improve a hot zone and control cooling rate in order to restrain crystal defect formation by using point defect diffusion. Korean Patent Application No. 2002-0021524 claims that the yield of a high quality single crystal ingot was enhanced by improving a heat shield and a water cooling pipe. Japanese Patent Application H05-061924 proposes to impart periodic variation to the growth rate of a Si single crystal ingot in order to prevent a crystal defect in the single crystal ingot by using the hysteresis of a region where a crystal defect such as OSF and oxygen precipitation defect takes place.

Conventional techniques for controlling the oxygen concentration of a Si single crystal ingot include Japanese Laid-Open Patent Application No. 10-013010, Korean Patent Registration No. 10-0239864, Korean Patent Application No. 2001-7011548 and so on. However, these techniques have drawbacks in that either they require additional investment or the high quality single crystal is not actually produced.

Furthermore, Korean Patent Registration No. 10-0271504 discloses a technique for locating the center of a CUSP magnetic field at a position of at least ⅓ depth of the total depth of Si melt in order to remove a slit formed in the growth direction and thus improve oxygen distribution in the radial direction. Korean Patent Registration No. 10-0239864 discloses a technique for ensuring uniform magnetic field distribution by using a superconductive horizontal magnetic field in order to restrain convection. Korean Patent Application Publication No. 2002-0081470 discloses a technique for adjusting the relation between solid-liquid interface configuration and crystallization temperature. However, such conventional techniques have not disclosed using an unbalanced magnetic field in order to control oxygen concentration in a high quality Si single crystal ingot that is free of agglomerated crystal defects.

Moreover, according to the afore-mentioned techniques, the sought-after high quality single crystal ingot can be produced only with a low yield.

SUMMARY OF THE INVENTION

Accordingly, the present invention has been made to solve the above-mentioned problems occurring in the prior art, and an object of the present invention is to provide a method capable of producing a Si single crystal ingot with a high productivity while controlling the Si single crystal ingot to have various oxygen concentrations.

Another object of the invention is to provide a high quality Si single crystal ingot and wafer having oxygen concentrations which are controlled variously according to specifications desirable to customers.

Further, another object of the invention is to provide an apparatus for growing a high quality Si crystal ingot having variously controlled oxygen concentrations.

Another object of the invention is to provide a method for growing a high quality Si single crystal ingot having a high productivity.

Yet another object of the invention is to provide an apparatus for growing a high quality Si single crystal ingot having a high yield.

In order to accomplish these objects, the invention provides a method for growing a silicon single crystal ingot by the Czochralski method, wherein an unbalanced magnetic field is applied to silicon melt.

Preferably, the unbalanced magnetic field is formed by controlling upper and lower magnetic fields to have strengths different from each other.

Preferably, the upper magnetic field is formed at a solid-liquid interface region, and the lower magnetic field is formed around a crucible bottom and a rounded portion.

Preferably, the temperature of silicon melt rises gradually in proportion to the distance from a single crystal ingot up to a hottest point and descends gradually from the hottest point when measured along an axis parallel with a longitudinal direction of the single crystal ingot starting from an interface between silicon melt and the single crystal ingot, and the unbalanced magnetic field is adapted to minimize oxygen dissolution from the crucible and promote melt convection from a portion of silicon melt which is most adjacent to the heater toward a center of the interface or a hot region surrounding the hottest point.

Preferably, the magnetic field strength at the solid-liquid interface region has a magnetic field strength of 0 gauss to 150 gauss, and the crucible bottom where oxygen is dissolved has a magnetic field strength of 100 gauss to 400 gauss.

Preferably, the ratio of vertical magnetic field strength per horizontal magnetic field strength at an edge of the solid-liquid interface is 0.1 to 1.0.

Preferably, the magnetic field comprises a CUSP magnetic field, or is directed upper or horizontal with respect to a longitudinal direction of the single crystal ingot.

Preferably, the silicon single crystal ingot is grown on conditions satisfying an equation of $3 \leqq Ln[Vs/Vc] \leqq 5$, where Vc is the rotation speed of a crucible containing silicon melt, and Vs is the rotation speed of the silicon single crystal ingot.

In order to accomplish these objects, the invention also provides an apparatus for growing a silicon single crystal ingot by the Czochralski method comprising: a chamber; a crucible provided inside the chamber, and containing silicon melt; a heater provided at a side of the crucible to heat silicon melt; a pulling mechanism for pulling the silicon single crystal ingot growing up from silicon melt; and a magnet provided at a side of the heater to apply a magnetic field to silicon melt.

Preferably, the magnet is adapted to induce the magnetic field to promote the convection of silicon melt directed toward the center of the silicon single crystal ingot.

Preferably, the magnet is adapted to induce the magnetic field to minimize the dissolution of oxygen from the crucible.

In order to accomplish these objects, the invention also provides a silicon wafer produced from a silicon single crystal grown by the Czochralski method, wherein a self-interstitial dominant defect-free region and a vacancy dominant defect-free region are distributed in a wafer plane, asymmetrically about the center of the wafer.

Preferably, interstitial oxygen concentration is under 9.5 ppma.

Preferably, interstitial oxygen concentration is from 9.5 ppma to 11.5 ppma.

Preferably, interstitial oxygen concentration is from 11.5 ppma to 14 ppma.

In order to accomplish these objects, the invention also provides a silicon single crystal ingot grown by the Czochralski method, wherein a self-interstitial dominant defect-free region is located in a central portion of the silicon single crystal ingot.

Preferably, the self-interstitial dominant defect-free region is surrounded by a first vacancy dominant defect-free region.

Preferably, the self-interstitial dominant defect-free region surrounds a second vacancy dominant defect-free region.

Preferably, the self-interstitial dominant defect-free region and the first and second vacancy dominant defect-free regions are distributed in a wafer plane, asymmetrically about the center of the wafer plane.

In order to accomplish these objects, the invention also provides a silicon wafer produced from a silicon single crystal grown by the Czochralski method, wherein a self-interstitial dominant defect-free region is located in a central portion of a wafer plane.

Preferably, the self-interstitial dominant defect-free region is surrounded by a first vacancy dominant defect-free region.

Preferably, the self-interstitial dominant defect-free region surrounds a second vacancy dominant defect-free region.

Preferably, the self-interstitial dominant defect-free region and the first and second vacancy dominant defect-free regions are distributed in a wafer plane, asymmetrically about the center of the wafer plane.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

The following detailed description will present a method for producing and apparatus for growing a high quality Si single crystal ingot and a wafer produced therefrom.

The present invention originates from the conception that, in growth of solid Si single crystal from Si melt, a high quality Si single crystal ingot of minimized point defects cannot be grown sufficiently by merely adjusting single crystal temperature gradient and solid-liquid interface profile, but that there may exist more decisive factors for the growth of the high quality Si single crystal ingot.

In order to overcome restrictions in solid state reaction subsequent to crystallization, the liquid state before solidification has been analyzed thoroughly, and as a result, it was found that the temperature distribution of Si melt is critical.

Crystal growth is generally carried out as growth units such as atoms or molecules migrate and adhere to a crystal growth interface or metastable region, in which rising temperature gradient in Si melt enhances driving force causing the liquid state growth units to migrate toward the crystal growth interface or metastable region.

Herein the crystal growth interface is also referred to as crystallization interface or solid-liquid interface where a solid Si single crystal ingot contacts liquid Si melt. The metastable region means a status of liquid Si melt ready for solidification, which has incomplete crystallinity.

Since high temperature gradient in Si melt drives more growth units to participate in crystal growth, low pulling rate causes excessive atoms to crystallize, thereby imparting self-interstitial rich characteristics to a Si single crystal ingot. On the contrary, low temperature gradient in Si melt fails to provide a sufficient number of atoms tending to crystallize so that high pulling rate imparts vacancy rich characteristics to the Si single crystal ingot.

Figure 1:
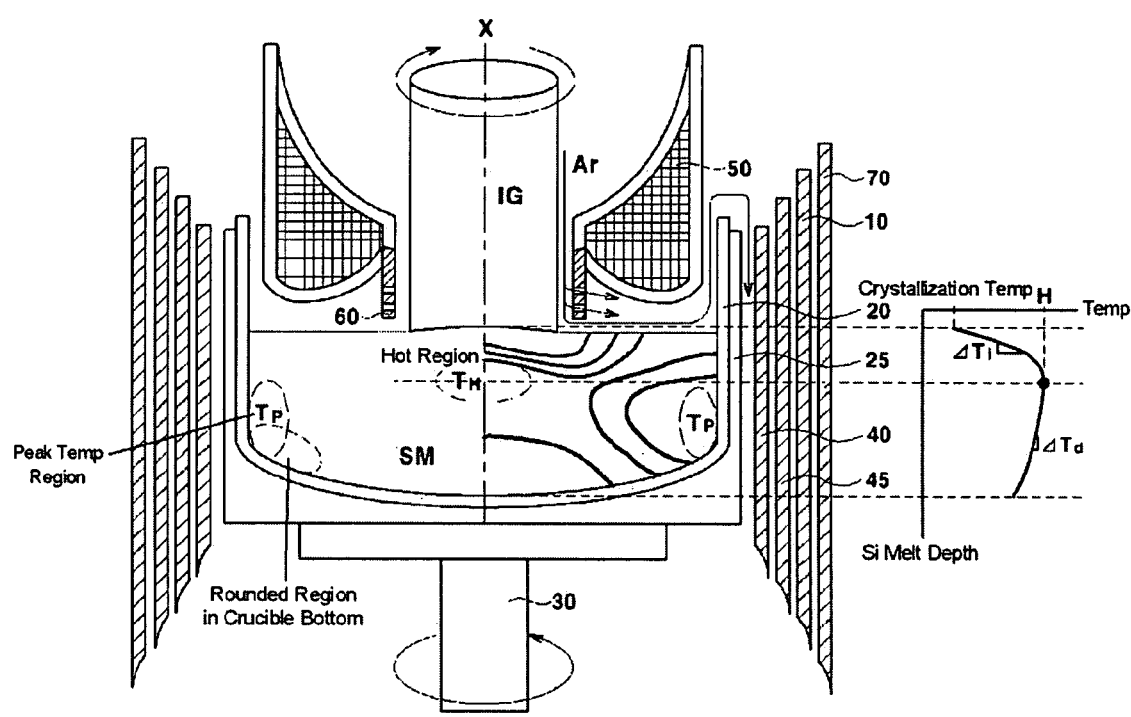
FIG. 1 is a schematic view illustrating a process for growing a Si single crystal ingot by the Czochralski method according to an embodiment of the invention, with the temperature gradient profile of Si melt measured along an axis parallel to the radial direction of the Si single crystal ingot.

FIG. 1 is a schematic view illustrating a process of Si single crystal growth by the Czochralski method according to an embodiment of the invention. As shown in FIG. 1, an apparatus for growing a Si single crystal ingot according to the invention includes a chamber 10 where the Si single crystal ingot is grown.

A quartz crucible 20 containing Si melt (indicated with SM) is installed inside the chamber 10, and a crucible support 25 made of graphite is installed surrounding the quartz crucible 20.

The crucible support 25 is fixed on a rotary shaft 30, which is rotated by drive means (not shown) to turn and elevate the quartz crucible 20, thereby maintaining a solid-liquid interface to a predetermined level. The crucible support 25 is surrounded by a cylindrical heater 40 at a predetermined gap, and the heater 40 is surrounded by a barrel-shaped thermostat or heat insulator 45.

That is, the heater 40 is installed aside the quartz crucible 20 to heat high purity polycrystal Si lump loaded in the quartz crucible 20 into Si melt SM, and the barrel-shaped thermostat 45 prevents heat radiated from the heater 40 from dispersing toward the wall of the chamber 10 thereby to enhance heat efficiency.

Furthermore, a magnet 70 is installed to surround the outer circumference of the barrel-shaped thermostat 45. This allows the heater 40 to be used as a stable heat source in order to prevent supercooling of the Si melt. Preferably, this can also control heat to be transferred to the solid-liquid interface via various paths from the heater 40 by adjusting the intensity of a magnetic field by the magnet 70. As a result, a more efficient heat transfer can be achieved.

In the present invention, the magnet 70 serves to induce magnetic fields of different strength to a region where oxygen is dissolved out of the quartz crucible 20 and to a solid-liquid interface. Generally, a CUSP magnetic field is used to restrain the convection of Si melt based upon balanced magnetic field distribution in order to control stable single crystal growth condition and oxygen concentration, but the condition of oxygen concentration control has been contradictory to the condition for high quality Si single crystal fabrication. However, the invention was made to overcome this problem.

In this case, an upper magnetic field controls the temperature distribution related with heat flow, and a lower magnetic field controls oxygen concentration within an ingot related with oxygen dissolution out of the crucible or migration of dissolved oxygen.

The magnetic field may be applied to Si melt vertically or horizontally to the longitudinal direction of single crystal, or CUSP magnetic field may be applied to Si melt. When flux lines are formed into specific shapes in the solid-liquid interface and Si melt thereunder, the same effects are obtained.

Figure 2:
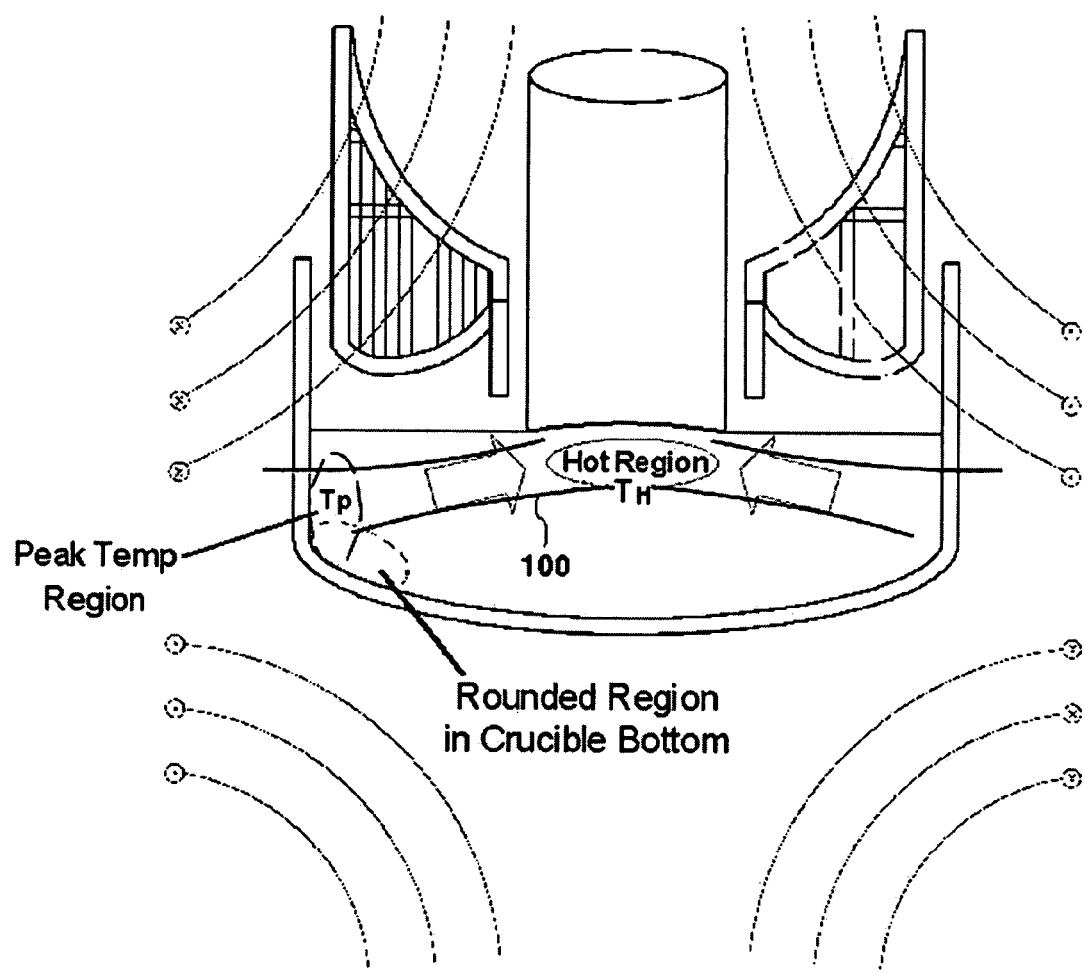
FIG. 2 is a cross sectional view illustrating growth of a Si single crystal ingot with a CUSP magnetic field induced thereto according to an embodiment of the invention, in which a suitable heat transfer channel is formed from a peak temperature region to a hot region.
Figure 3A:
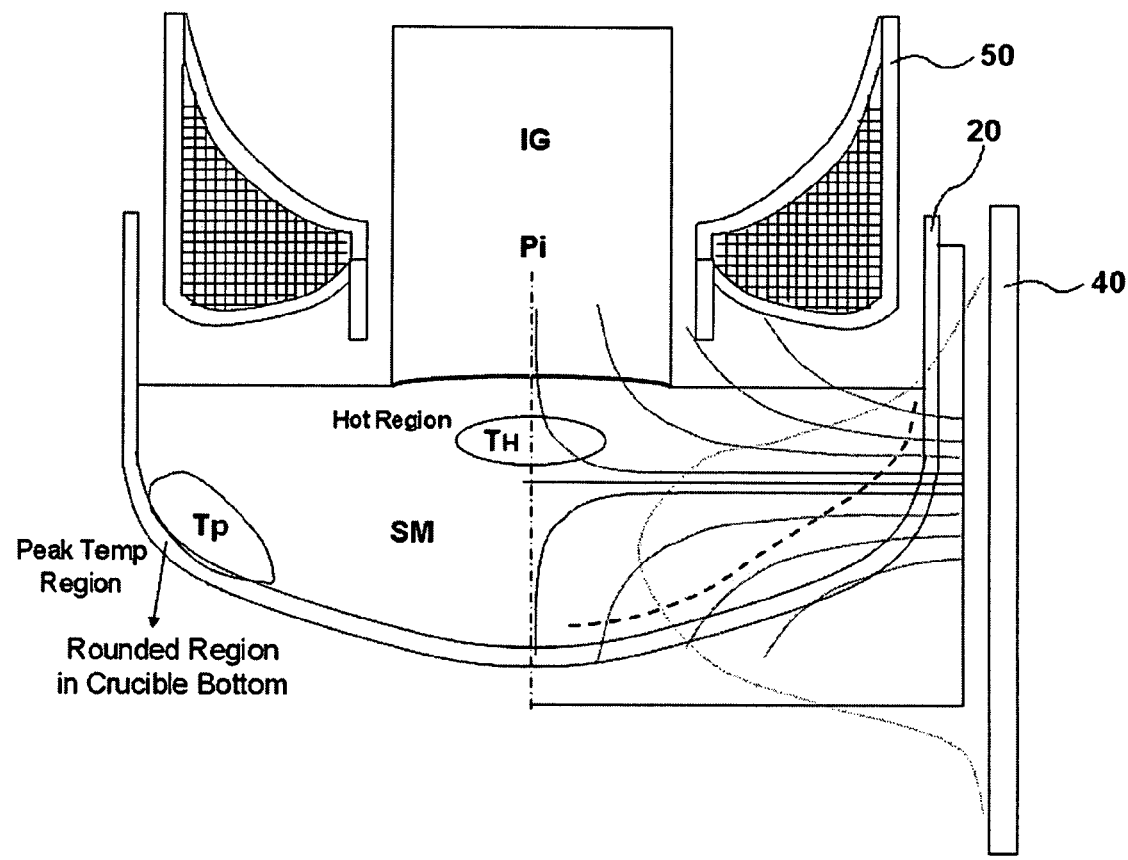
FIG. 3a is a cross sectional view illustrating growth of a Si single crystal ingot by adjusting the position of a magnet with a substantially balanced CUSP magnetic field, in which a flux line profile is shown in half.
Figure 3B:
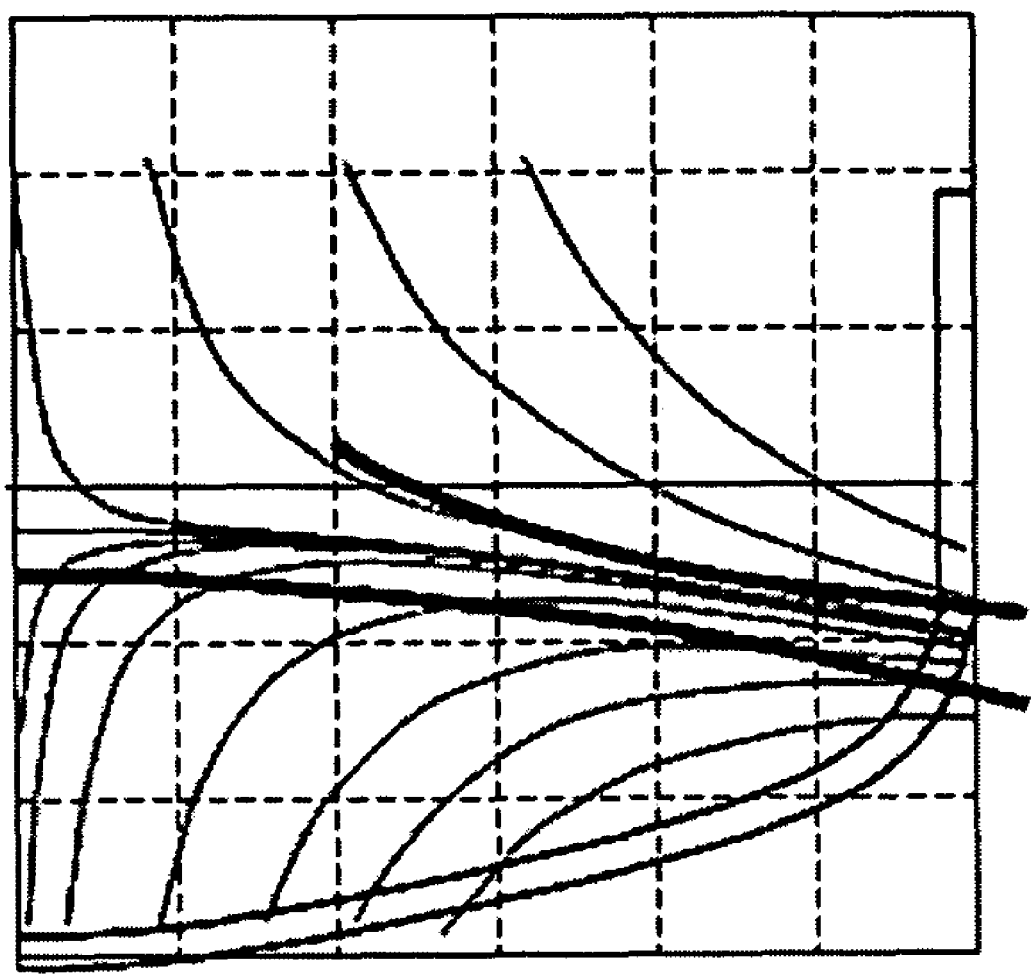
FIG. 3b is a graph illustrating the flux line profile shown in FIG. 3a plotted with scales.
Figure 4A:
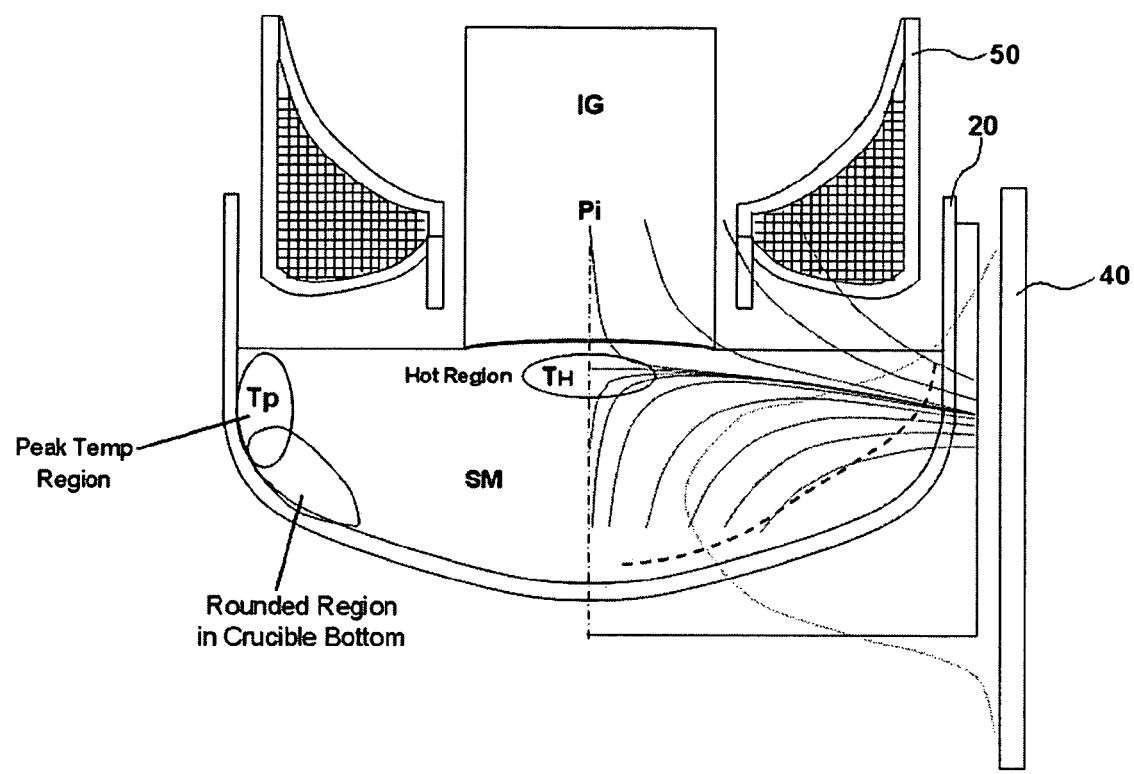
FIG. 4a is a cross sectional view illustrating growth of a Si single crystal ingot with a balanced CUSP magnetic field according to an embodiment of the invention, in which a flux line profile is shown in half.
Figure 4B:
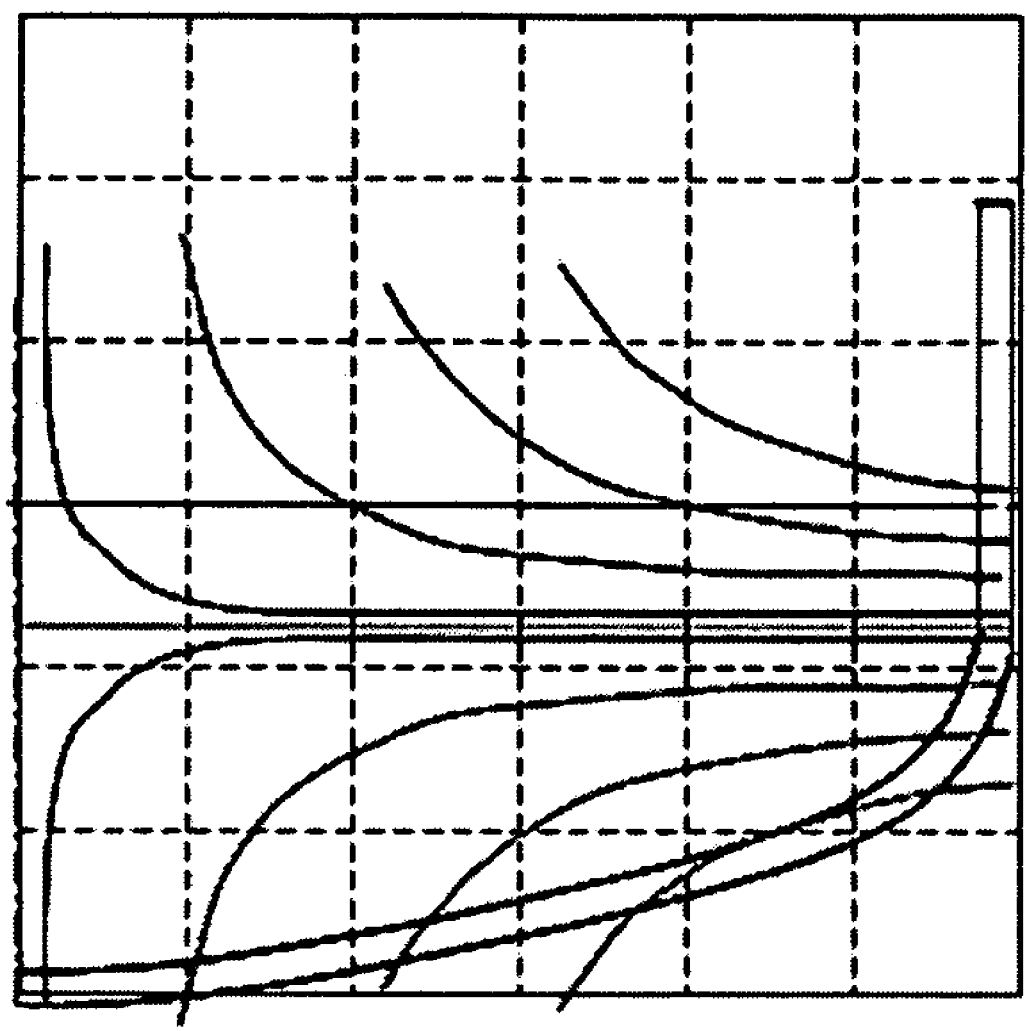
FIG. 4b is a graph illustrating the flux line profile shown in FIG. 4b plotted with scales.

FIG. 2 is a cross sectional view illustrating growth of a Si single crystal ingot with a CUSP magnetic field applied thereto according to an embodiment of the invention, in which a suitable heat transfer channel is formed from a peak temperature region to a hot region, FIG. 3a is a cross sectional view illustrating growth of a Si single crystal ingot by adjusting the position of a magnet with a substantially unbalanced CUSP magnetic field, in which a flux line profile is shown in half, FIG. 3b is a graph illustrating the flux line profile shown in FIG. 3a plotted with scales, FIG. 4a is a cross sectional view illustrating growth of a Si single crystal ingot with a CUSP magnetic field applied asymmetrically according to an embodiment of the invention, in which a flux line profile is shown in half, and FIG. 4b is a graph illustrating the flux line profile shown in FIG. 4b plotted with scales.

The magnetic field controls the convention of Si melt, and more particularly, restrains melt flow in a direction perpendicular to flux lines, thereby even influencing heat flow. That is, the flux line profiles as shown in FIGS. 2 to 4b restrain melt convection in a direction perpendicular to the flux lines but drive melt flow and heat flow in a direction to be parallel with the flux lines.

Then, hot Si growth units migrate from a localized peak temperature region $T_P$, which is most adjacent to the heater, to a solid-liquid interface along the shortest paths, thereby minimizing heat loss as well as promoting heat flow toward the center of the solid-liquid interface or a hot region $T_H$ of Si melt.

That is, the magnetic field facilitates heat transfer from the peak temperature region $T_P$ to the hot region $T_H$ with a minimized heat loss, increasing the temperature difference between the solid-liquid interface and the hot temperature region $T_H$ or the temperature gradient of rising melt. This as a result enhances the driving force causing the growth units, such as atoms and molecules, to migrate toward the crystal growth interface, thereby increasing the growth rate of high quality crystal.

Furthermore, unbalanced magnetic flux line profiles as shown in FIGS. 3a to 4b make the temperature around the bottom of the quartz crucible relatively lower, thereby minimizing oxygen dissolution from the crucible bottom as well as migration of dissolved oxygen. So, a lower magnetic field may be strengthened for the purpose of restraining oxygen dissolution from the crucible bottom or migration of dissolved oxygen.

As a result, the unbalanced magnetic field can be formed by adjusting the strengths of upper and lower magnetic fields to be asymmetrical from each other. Preferably, the upper magnetic field is formed around the solid-liquid interface and the lower magnetic field is formed around a portion where oxygen erupts from the quartz crucible.

Furthermore, it is preferable to control the strength of the magnetic field around the solid-liquid interface to be between 0 gauss and 150 gauss and the magnetic field around the crucible bottom and the rounded portion where oxygen is dissolved by largest quantity to be between 100 gauss and 400 gauss. The solid-liquid interface portion may be Zero Gauss Position (ZGP) where magnetic field strength becomes 0. If the solid-liquid interface portion has a magnetic field strength of 150 gauss or more, heat transfer to the solid-liquid interface may worsen. On the other hand, a suitable heat transfer channel is not formed around the rounded portion of the crucible bottom if the magnetic field strength of this portion is under 100 gauss or exceeds 400 gauss.

Preferably, the ratio of vertical to horizontal magnetic field strength at an edge of the solid-liquid interface is controlled in the range of 0.1 to 1.0. If the vertical to horizontal magnetic field strength ratio is under 0.1 or over 1.0, a suitable heat transfer channel will not be formed.

FIGS. 3a and 3b show a magnetic flux profile where the magnetic field in the center of the solid-liquid interface is 100 gauss and the magnetic field around the rounded portion of the crucible bottom dissolving oxygen by largest quantity is 190 gauss. On the other hand, FIGS. 4a and 4b show a magnetic flux profile where the magnetic filed in the center of the solid-liquid interface is 20 gauss and the magnetic field around the rounded portion of the crucible bottom dissolving oxygen by largest quantity is 340 gauss.

As mentioned above, by adjusting the relative strength of upper and lower magnetic fields or the ratio of vertical to horizontal magnetic field strength at the solid-liquid interface, it is possible to realize a high yield for a Si single crystal ingot or wafer having various oxygen concentrations desirable to customers such as under 9.5 ppma, 9.5 ppma or more, 11.5 ppma or less, over 11.5 ppma and 14 ppma or less.

That is, the present invention is aimed to control a major quality item of oxygen concentration into desired values while producing a high quality Si single crystal free of crystal defects. For this purpose, unbalanced magnetic field profile is applied to Si melt in order to control the magnetic field strength of the oxygen dissolving portion of the quartz crucible with a different value from that of the sold-liquid interface.

In addition, winding means (not shown) is installed above the chamber 10 to wind up a cable, and a seed crystal is provided at the bottom tip of the cable in contact with Si melt SM inside the quartz crucible 20 so that a Si single crystal ingot IG is grown in response to the winding-up of the cable and elevation of the seed crystal. The winding means carries out rotation while winding up the cable during the growth of the Si single crystal ingot IG, in which the Si single crystal ingot IG is raised while being rotated coaxially with the rotary shaft 30 of the crucible 20, but in the reverse direction.

Inert gas such as Ar, Ne and N is supplied to the growing single crystal ingot IG and Si melt SM via a top portion of the chamber 10, and used inert gas is exhausted via a lower portion of the chamber 10.

Preferably, a heat shield 50 is installed between the Si single crystal ingot IG and the crucible 20 to surround the ingot IG in order to prevent heat dissipation from the ingot IG. It is also preferable that a cylindrical heat cover 60 is also attached to the heat shield 50 at a portion most adjacent to the Si single crystal ingot IG in order to further shield heat flow thereby keeping the heat.

More detailed description will be given with reference to FIG. 1 which illustrates isothermal lines together with the temperature gradient profile of Si melt measured along an axis parallel to the radial direction of the Si single crystal ingot.

Examining the temperature of Si melt SM in general, peak temperature is found in a portion of Si melt SM (designated with $T_P$ region in FIG. 1) placed in a side portion of the crucible 20 most adjacent to the heat source or heater 40, and minimum temperature or solidification temperature is found in a solid-liquid interface where crystal growth takes place.

In measurement of the temperature gradient of Si melt SM along an axis parallel with the radial direction of a single crystal ingot IG, the temperature gradient becomes a vertical instantaneous gradient, which is preferably measured at a Si melt portion located under the Si single crystal ingot IG.

The high quality Si single crystal ingot is preferably grown in conditions where the measured temperature gradient satisfies Equation 1 below:

$$(\Delta T max - \Delta T min)/\Delta T min \times 100 \leq 10 \quad \text{Equation 1,}$$

where $\Delta T max$ is the maximum temperature gradient measured, and $\Delta T min$ is the minimum temperature gradient measured (refer to Korean Patent Application Publication No. 2004-98530).

In addition, referring to FIG. 2 which illustrates the temperature gradient profile of Si melt measured along an axis parallel with the longitudinal direction of a single crystal ingot, the present invention provides a hot region (designated with $T_H$ in FIG. 1) in Si melt that is relatively hotter than the surrounding region, and especially controls the temperature gradient in a region ranging from above to under the hot region TH.

When measuring the temperature of Si melt SM along the axis X parallel with the longitudinal direction of the Si single crystal ingot IG, the temperature of Si melt SM, starting from the solid-liquid interface, rises gradually up to the peak or hottest point H in proportion to the distance from the ingot IG, but starting from the hottest point H, descends gradually to the bottom of Si melt SM which is farthest from the ingot IG.

In this case, the Si single crystal ingot IG is grown preferably by maintaining a condition $\Delta Ti > \Delta Td$, in which $\Delta Ti$ is the temperature gradient of Si melt rising from the solid-liquid interface up to the hottest point H, and $\Delta Td$ is the temperature gradient of Si melt descending from the hottest point H to the melt bottom. The axis X acting as a reference of indicating temperature measurement position is preferably a central axis passing through the center of the Si single crystal ingot IG.

The hottest point H preferably exists at a point of about $\frac{1}{3}$ to $\frac{2}{3}$ of the total depth of Si melt SM, measured from the head (see Korean Patent Application No. 2004-0098530).

Furthermore, the temperature gradient of Si melt in the radial direction decreases in response to the reduction of the rotation speed of the crucible, making uniform temperature distribution of Si melt in the radial direction. So, the rotation speed of the crucible should be lowered as much as possible in order to make the temperature of Si melt be uniform in the radial direction of the single crystal ingot (see Korean Patent Application No. 2004-0098530).

Furthermore, the operation range of the rotation speed of the single crystal ingot IG should be determined while taking into consideration the rotation speed of the crucible 20 in order to produce high quality single crystal with a high productivity.

If the Si single crystal ingot rotates too fast, compared to slow rotation of the crucible, cold Si melt rises up from the crucible bottom. This as a result lowers the temperature of a hot region, and thus drops the vertical temperature gradient of Si melt.

So, it is preferable that the Si single crystal ingot is grown according to conditions satisfying Equation 2 below:

$$3 \leq Ln[Vs/Vc] \leq 5 \quad \text{Equation 2,}$$

where Vc is the rotation speed of the crucible, and Vs is the rotation speed of the Si single crystal ingot.

By optimizing the temperature distribution of Si melt as described above, it was found that high quality single crystal free of crystal defects can be obtained easily and growth rate is improved remarkably.

This phenomenon results from the fact that driving force causing growth units, such as atoms and molecules, to migrate toward crystal growth interface increases as the temperature gradient of Si melt rising from the solid-liquid interface to the hottest point is made larger. This as a result can accelerate the pulling speed of crystal or the growth rate of high quality crystal that minimizes point defects such as vacancy and interstitial.

Through heater improvement, magnetic field application and controlled rotation speed of crucible and single crystal as mentioned above, the temperature distribution of Si melt is optimized in the radius and longitudinal directions of the single crystal ingot as described above owing to so-called "channel effect."

Channel effect refers to minimum-loss heat conduction from a hottest region toward a high temperature region of the melt along an imaginary channel 100 as shown in FIG. 4b. Such a channel effect can increase the temperature gradient of rising melt, that is, the temperature gradient of a melt portion ranging from the solid-liquid interface to a high temperature region. Then, the crucible bottom is relatively cooled down, thereby restricting oxygen dissolution therefrom.

With the above described means, the present invention can control point defects such as vacancy and interstitial, thereby restraining various defects, such as dislocations of growth defects (e.g., edge, screw and loop type dislocations), stacking faults and voids (in the form of a group of vacancies).

Recent development in Si wafer fabrication technology allows realization of defect-free wafers, which are free of agglomerated point defects as described above. Even though concentration is not high to such a degree that agglomeration may take place, relatively high concentration of vacancy and oxygen can create secondary defects such as micro precipitate in the vicinity of an active device region during heat treatment of an actual fabrication process of semiconductor devices.

However, the afore-described apparatus and method according to the embodiment of the invention can sufficiently lower vacancy concentration in a Si single crystal ingot grown thereby so that defects, such as micro precipitates, are not formed in the vicinity of an active device region. That is, this invention can realize high productivity wafers having a point defect concentration within critical saturation concentration of vacancies that can form into micro precipitates during heat treatment. In this case, heat treatment conditions and results are reported from Korean Patent Application No. 2004-0098530.

Figure 5A:
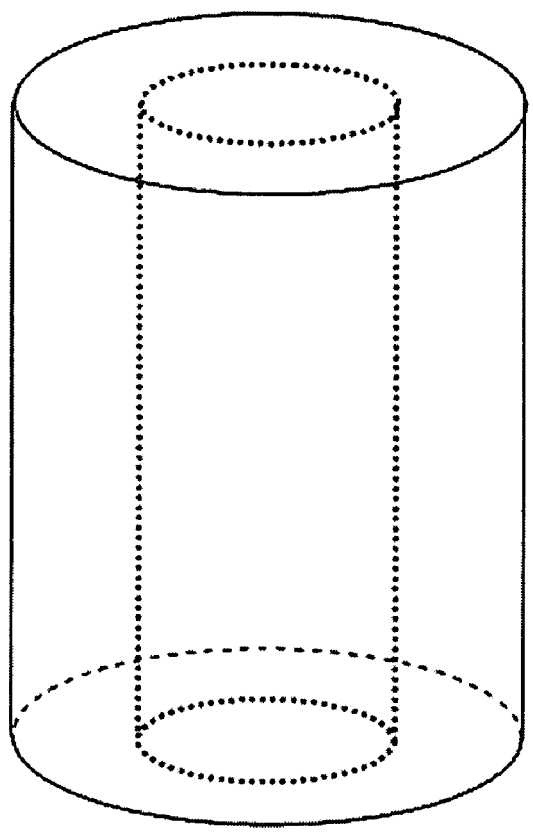
FIG. 5a is a schematic perspective view of a Si single crystal ingot and a cross-sectional view of a wafer of the prior art having an axially symmetric distribution, in which a vacancy dominant region is formed in a central portion of the wafer and an interstitial dominant region is formed around the vacancy rich region.
Figure 5A:
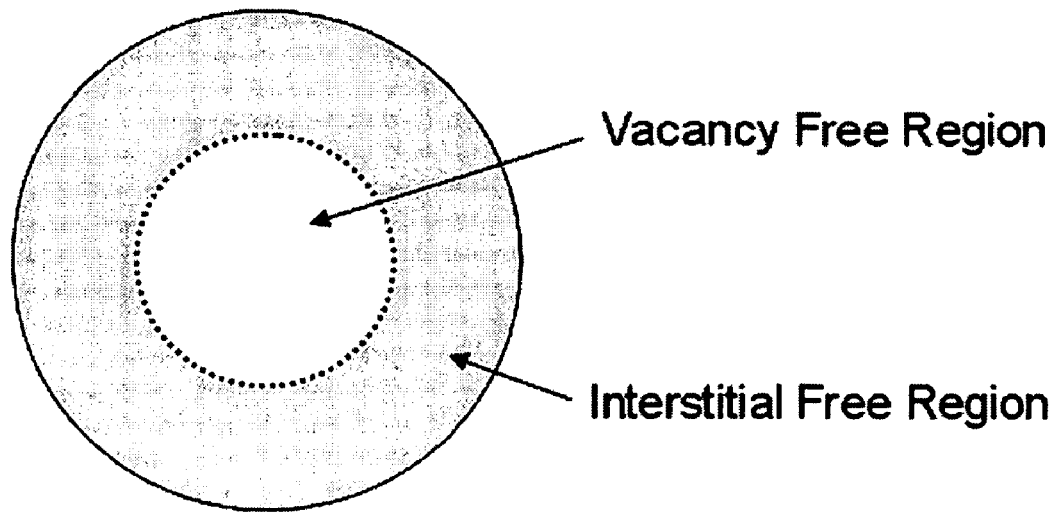
Figure 5B:
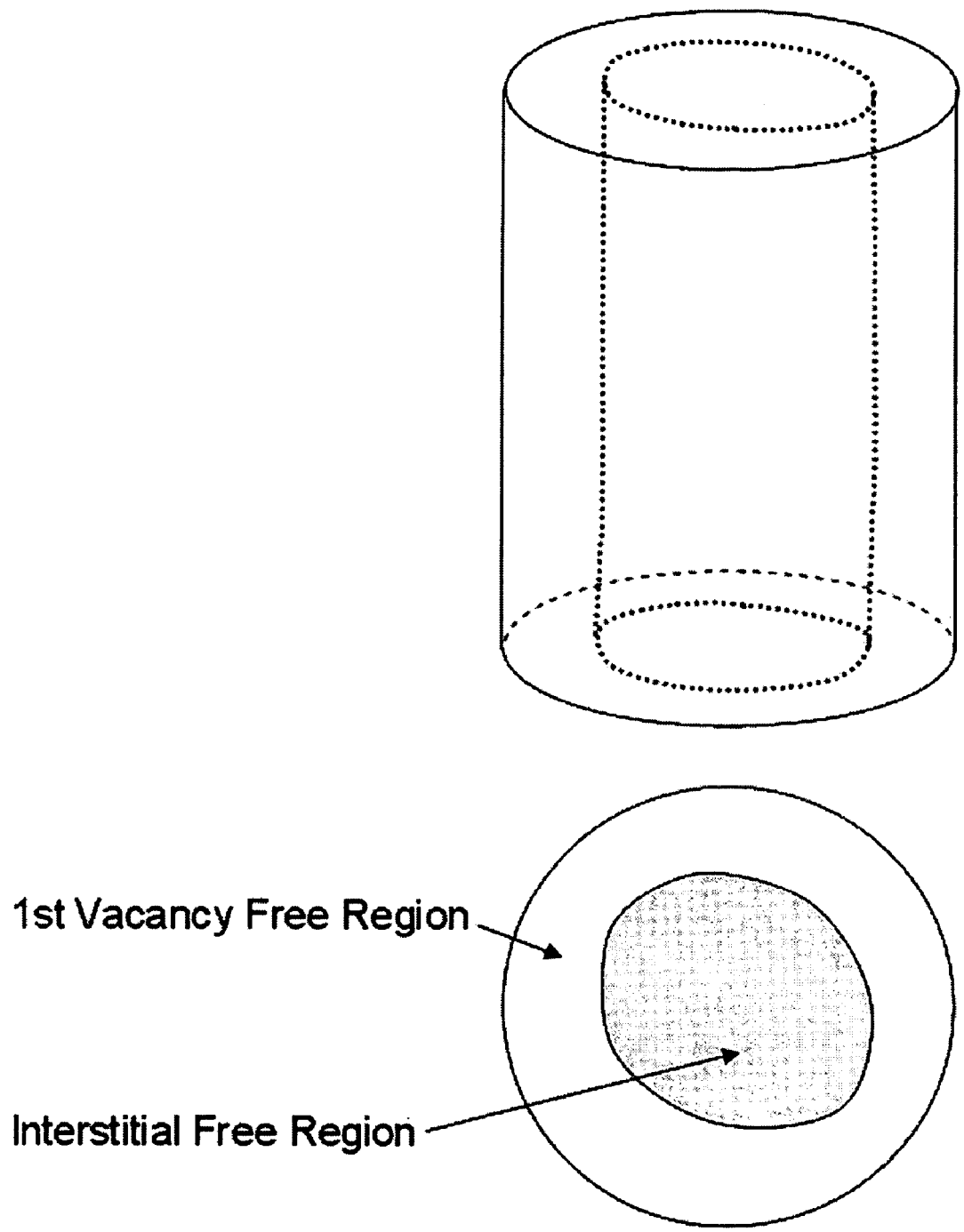
FIG. 5b is a schematic perspective view of a Si single crystal ingot and a cross-sectional view of a wafer according to the invention having an asymmetric distribution, in which a first vacancy dominant defect-free region surrounds a self-interstitial dominant defect-free region located in a central portion of an ingot/wafer plane.
Figure 5C:
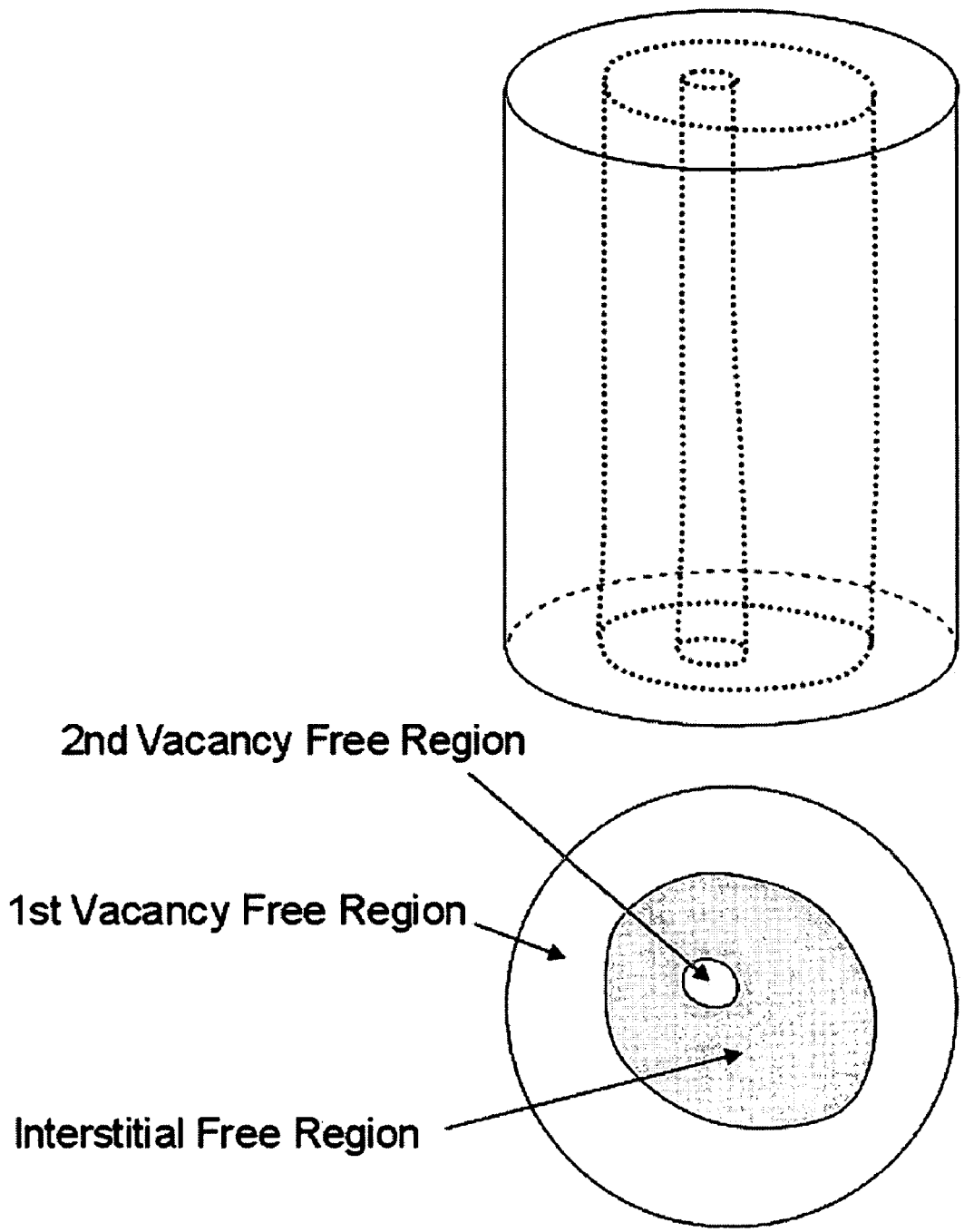
FIG. 5c is a schematic perspective view of a Si single crystal ingot and a cross-sectional view of a wafer according to the invention having an asymmetric distribution, in which a self-interstitial dominant defect-free region is surrounded by a second vacancy dominant defect-free region.

In the past, a central portion of a wafer has been a vacancy rich region and its periphery was an interstitial rich region (see FIG. 5a). However, their distribution is currently getting reversed owing to the development of wafer fabrication techniques. Accordingly, also in the present invention, an interstitial rich region may be formed in a central portion of a Si ingot and a wafer, and a vacancy rich region may be formed in the periphery (see FIGS. 5b and 5c). Moreover, even a balanced region is obtained having balanced interstitial-vacancy concentration without any interstitial rich region or vacancy rich region.

Furthermore, since the invention is based upon a fluid mechanism, that is, the temperature distribution in Si melt is asymmetric about the center in single crystal growth, the interstitial and vacancy dominant regions are always found asymmetrically about a central axis in the longitudinal direction of an ingot. However, this does not cause any problem in obtaining a high quality single crystal ingot and wafer. That is, in a silicon wafer manufactured according to the invention, the interstitial dominant region and the vacancy dominant region may be arranged asymmetric about the center of the wafer.

Generally two types of convection exist in Si melt. That is, the convection distribution of Si melt SM is divided into an outer area, which rises to the head of Si melt SM along the bottom and sidewall of the crucible and then circulates toward the single crystal ingot along the head of Si melt SM, and an inside portion which circulates adjacent to the bottom of the single crystal ingot along the inside slope of the periphery.

Examples of melt convention preferable in the invention are described in detail in Korean Patent Application Nos. 2000-0071000 and 2003-0080998, by which the quality of single crystal can be made more uniform in its radial direction.

The present invention will be described in more detail through the following examples, wherein 200 mm Si single crystal ingots are grown. However, it is to be understood that the following examples are given for illustrative purpose only but do not limit the protection scope of the invention.

EXAMPLE 1

Si single crystal ingot having asymmetric point defect concentration distribution where interstitial is dominant in ingot center and vacancy is dominant in outer periphery.

The temperature distribution of Si melt was controlled by adjusting the rotation speed of a single crystal ingot and the rotation speed of a crucible. The rotation speed of the single crystal ingot was 13 rpm to 17 rpm, and the rotation speed of the crucible was 0.3 rpm to 0.8 rpm. In order to effectively control point defect concentration in the Si single crystal ingot, the temperature distribution of Si melt was controlled instead of the Si single crystal ingot.

By increasing the vertical temperature gradient of Si melt from the growth interface of the Si single crystal ingot to a 10 mm to 100 mm depth portion, limit pulling speed for interstitial-to-vacancy transition in the ingot center was enhanced by a large value.

A vertical section sample of the grown up single crystal ingot was picked up and quality distribution, such as defects, was measured from the sample. Since the temperature distribution control of the silicon melt (not the single crystal ingot) was focused on, quality area distribution asymmetric about the center was obtained, and limit pulling speed for interstitial-to-vacancy transition was 0.56 mm/min. Obtained oxygen concentration showed limited values ranging from 12.5 ppma to 13.5 ppma. Test results are reported in Table 1 below.

Figure 6:
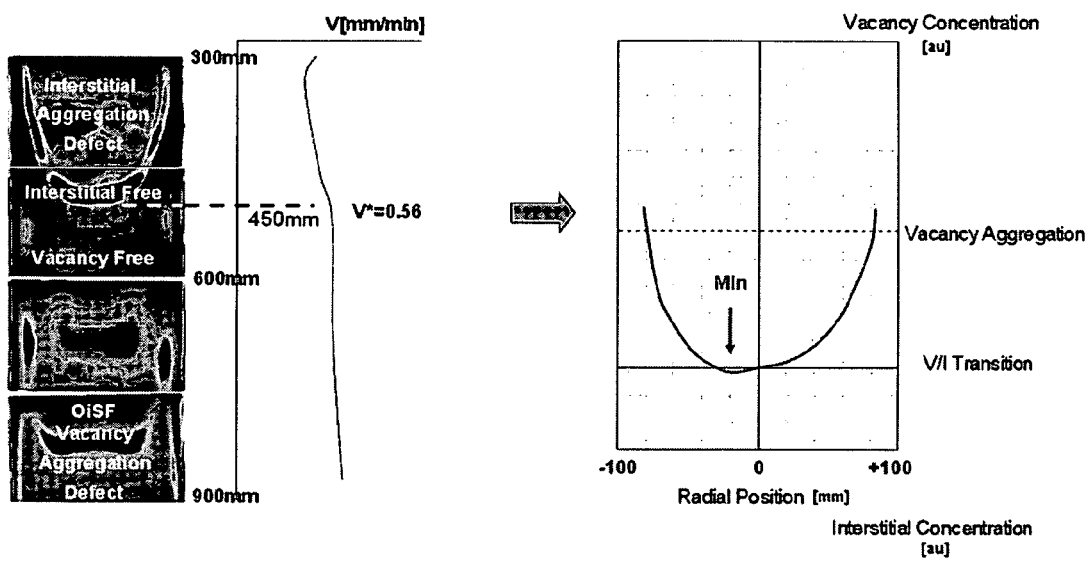
FIG. 6 includes pictures illustrating axial cross sectional images of a Si single crystal ingot grown according to an embodiment of the invention, scanned with minority carrier lifetime after oxygen precipitation heat treatment, and a graph illustrating pulling speed as a function of crystal length.

FIG. 6 includes pictures illustrating axial cross sectional images of a Si single crystal ingot grown according to an embodiment of the invention, scanned with minority carrier lifetime after oxygen precipitation heat treatment, and a graph illustrating pulling speed as a function of crystal length. It can be seen that vacancy related defect of an OSF ring was found in an ingot edge while the ingot center is V/I interface at 450 mm length position of the ingot where pulling speed is v=v*.

EXAMPLE 2

Si single crystal ingot having asymmetric point defect concentration distribution where point defect is extremely controlled The temperature distribution of Si melt was improved by adjusting the center position and magnetic field strength of a CUSP magnetic field in addition to the rotation speed of a single crystal ingot and the rotation speed a crucible. The single crystal ingot and the crucible were given with the same rotation speeds as in Example 1. The magnetic field strength was 100 gauss at the solid-liquid interface center and 190 gauss at the rounded bottom portion.

The temperature distribution of Si melt is adjusted instead of that of the Si single crystal ingot in order to extremely control the point defect concentration. That is, by increasing the vertical temperature gradient of Si melt from the growth interface of the Si single crystal ingot to 30 mm depth point of Si melt, the pulling speed of the single crystal ingot was remarkably enhanced so that both of vacancy and interstitial concentrations can now be controlled precisely. At the same time, the horizontal/vertical component distribution of the magnetic field was adjusted so that heat can be transferred from a heater to the hot region in the central axis of melt and the solid-liquid interface via shortest paths.

A vertical section sample of the grown up single crystal ingot was picked up and quality distribution such as defects was measured from the sample. Quality area distribution asymmetric about the center was obtained, limit pulling speed for interstitial-to-vacancy transition was 0.63 mm/min, and oxygen concentration obtained was 13 ppma or more. Test results are reported in Table 1 below.

Figure 7:
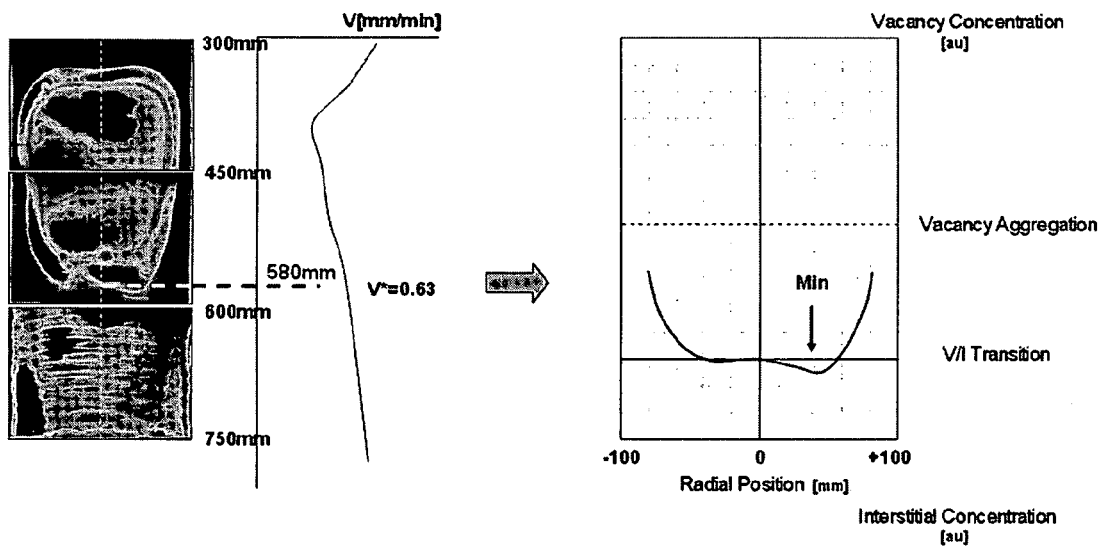
FIG. 7 includes pictures illustrating axial cross sectional images of a Si single crystal ingot grown according to another embodiment of the invention, scanned with minority carrier lifetime after oxygen precipitation heat treatment, and a graph illustrating pulling speed as a function of crystal length.

FIG. 7 contains pictures illustrating axial cross sectional images of a Si single crystal ingot grown according to another embodiment of the invention, scanned with minority carrier lifetime after oxygen precipitation heat treatment, and a graph illustrating pulling speed as a function of crystal length. It can be seen that no defects were found in the radial direction around 580 mm length position of the ingot where pulling speed is v=v*.

EXAMPLE 3

High quality Si single crystal ingot having asymmetric point defect concentration distribution where oxygen concentration is controlled By setting unbalanced CUSP upper and lower magnetic field strengths, in addition to the rotation speed of a single crystal ingot and the rotation speed of a crucible, heat transfer was made more efficient and oxygen concentration was lowered. The single crystal ingot and the crucible were given with the same rotation speeds as in Example 1. The magnetic field strength was 20 gauss at the solid-liquid interface center and 340 gauss at the rounded bottom portion.

That is, the lower magnetic field strength was enhanced to lower oxygen concentration and the upper magnetic field strength was adjusted relatively weak so that heat could be transferred from a heater to the solid-liquid interface via the shortest path. In this case, the magnetic fields were adjusted to maintain the shape of heat channels uniform.

A vertical section sample of the grown up single crystal ingot was picked up and quality distribution, such as defects, was measured from the sample. Quality area distribution asymmetric about the center was obtained, limit pulling speed for interstitial-to-vacancy transition was 0.64 mm/min, and oxygen concentration was 11 ppma or less. Test results are reported in Table 1 below.

Figure 8:
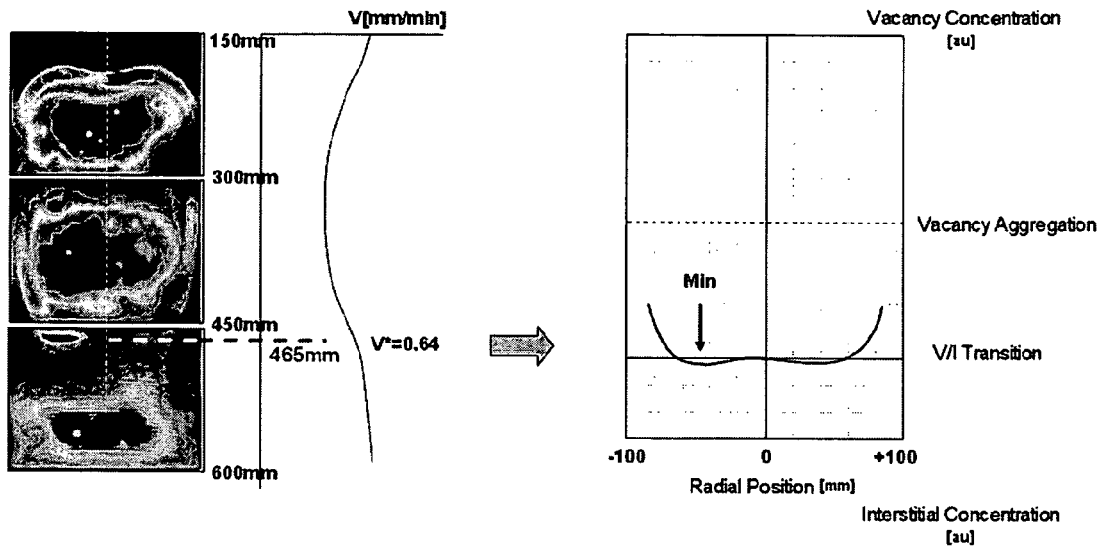
FIG. 8 includes pictures illustrating axial cross sectional images of a Si single crystal ingot grown according to further another embodiment of the invention, scanned with minority carrier lifetime after oxygen precipitation heat treatment, and a graph illustrating pulling speed as a function of crystal length.

FIG. 8 is pictures illustrating axial cross sectional images of a Si single crystal ingot grown according to further another embodiment of the invention, scanned with minority carrier lifetime after oxygen precipitation heat treatment, and a graph illustrating pulling speed as a function of crystal length. It can be seen that no defects were found in the radial direction around 465 mm length position of the ingot where pulling speed is v=v*.

COMPARATIVE EXAMPLE

A hot zone was arranged in order to control the temperature distribution of a single crystal ingot as disclosed in Korean Patent Application No. 1998-0026790, and a single crystal ingot was grown according to the prior art by varying the pulling speed of the ingot by inducing a strong horizontal magnetic field to control the solid-liquid interface profile to be convex toward the ingot.

A vertical section sample of the grown up single crystal ingot was picked up and quality distribution such as defects was measured from the sample. Quality area distribution symmetric about the center was observed, limit pulling speed for interstitial-to-vacancy transition was relatively low of 0.48 mm/min, and oxygen concentration had restricted value of about 12 ppma to 13 ppma. Test results are reported in Table 1 below.

Figure 9:
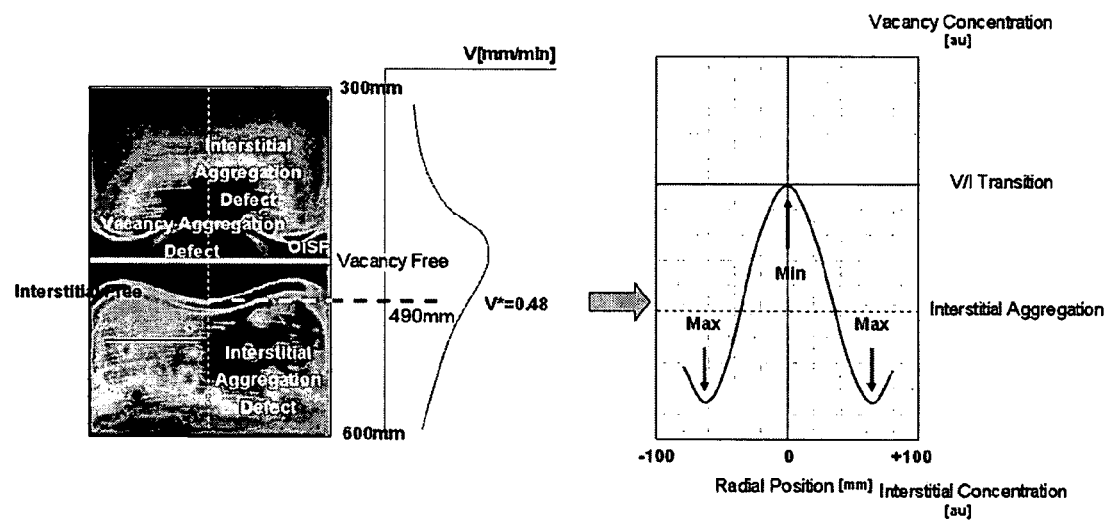
FIG. 9 includes pictures illustrating axial cross sectional images of a Si single crystal ingot grown according to the prior art, scanned with minority carrier lifetime after oxygen precipitation heat treatment, and a graph illustrating pulling speed as a function of crystal length.

FIG. 9 is pictures illustrating axial cross sectional images of a Si single crystal ingot grown according to the prior art, scanned with minority carrier lifetime after oxygen precipitation heat treatment, and a graph illustrating pulling speed as a function of crystal length. It can be seen that no defects were found in the radial direction around 490 mm length position of the ingot where pulling speed is v=v*.

TABLE 1

| | Pulling Speed (V) | Magnetic field strength at R* position (Gauss) | Vertical/ horizontal magnetic field strength ratio at G* | Interstitial Oxygen Concentration (ppma) |
|---|---|---|---|---|
| Example 1 | 0.56 | 0 | — | 12.5~13.5 |
| Example 2 | 0.63 | 100/190 | 0.9 | 13~15 |
| Example 3 | 0.64 | 20/340 | 0.2 | 9~11 |
| Comp. Exam. 1 | 0.48 | 2500~3500 | 0.05 | 12~13 |

R*: Growth interface center/crucible rounded
G*: Growth interface edge

According to the invention as described above, there are following effects.

First, by controlling the temperature distribution of Si melt in specific conditions proposed by the invention, it is possible to grow a high quality Si single crystal with various oxygen concentrations.

Furthermore, the present invention can provide an unbalanced magnetic field to Si melt so that the magnetic field strength of a region where oxygen is dissolved from the quartz crucible is different from that of a solid-liquid interface region.

In addition, the present invention can adjust the strength of upper and lower magnetic fields and the vertical/horizontal magnetic field strength at the solid-liquid interface, thereby growing a single crystal ingot with a high productivity while satisfying various oxygen specifications in the ingot desirable to customers.

Furthermore, the present invention can induce an unbalanced magnetic field with a strong lower magnetic field to Si melt in order to restrain oxygen dissolution from the crucible bottom or the rounded portion and minimize the migration of dissolved oxygen, thereby lowering the oxygen concentration of the Si single crystal ingot.

In addition, the present invention can adjust the ratio between upper magnetic field strength and lower magnetic field strength at a suitable value in order to increase the temperature difference between the solid-liquid interface and the hot region $T_H$ or the rising temperature gradient, thereby enhancing the growth rate of the single crystal ingot.

As a result, the high growth rate can enhance the yield of high quality Si single crystal ingots.

Furthermore, the present invention can provide a Si wafer having substantially asymmetrically-distributed point defect concentration instead of conventional symmetrically-distributed point defect concentration, as well as a high quality Si single crystal ingot and Si wafer having a low point defect concentration in such a level that secondary defects such as micro precipitates do not take place in the vicinity of an active device area by heat treatment.

Moreover, the present invention can enhance the yield of an electronic device by using a wafer machined from the high quality single crystal ingot as a substrate.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for growing a silicon single crystal ingot by the Czochralski method, wherein an unbalanced magnetic field is applied to silicon melt and is formed by controlling upper and lower magnetic fields to have strengths different from each other.

2. The method according to claim 1, wherein the upper magnetic field is formed at a solid-liquid interface region, and the lower magnetic field is formed around a crucible bottom and a rounded portion.

3. The method according to claim 1, wherein the temperature of silicon melt rises gradually in proportion to the distance from a single crystal ingot up to a hottest point and descends gradually from the hottest point when measured along an axis parallel with a longitudinal direction of the single crystal ingot starting from an interface between silicon melt and the single crystal ingot, and wherein the unbalanced magnetic field is adapted to minimize oxygen dissolution from the crucible and promote melt convection from a portion of silicon melt which is most adjacent to the heater toward a center of the interface or a hot region surrounding the hottest point.

4. The method according to claim 1, wherein the magnetic field strength at the solid-liquid interface region has a magnetic field strength of 0 gauss to 150 gauss, and the crucible bottom where oxygen is dissolved has a magnetic field strength of 100 gauss to 400 gauss.

5. The method according to claim 1, wherein the ratio of vertical magnetic field strength per horizontal magnetic field strength at an edge of the solid-liquid interface is 0.1 to 1.0.

6. The method according to claim 1, wherein the magnetic field comprises a CUSP magnetic field.

7. The method according to claim 1, wherein the magnetic field is directed vertical or horizontal with respect to a longitudinal direction of the single crystal ingot.

8. The method according to claim 1, wherein the silicon single crystal ingot is grown on conditions where the temperature of silicon melt rises gradually in proportion to the distance from a single crystal ingot up to a hottest point and descends gradually from the hottest point when measured along an axis parallel with a longitudinal direction of the single crystal ingot starting from an interface between silicon melt and the single crystal ingot, and the rising temperature gradient of silicon melt is larger than the descending temperature gradient of silicon melt.

9. The method according to claim 8, wherein the hottest point is located in a position 1/5 to 2/3 distance from the head of silicon melt with respect to the total depth of silicon melt.

10. The method according to claim 1, wherein the silicon single crystal ingot is grown on conditions satisfying an equation of $3 \leq Ln[Vs/Vc] \leq 5$, where Vc is the rotation speed of a crucible containing silicon melt, and Vs is the rotation speed of the silicon single crystal ingot.

11. A method for producing high quality silicon wafers by machining a silicon single crystal ingot grown according to claim 1.

* * * * *